(12) United States Patent
Feng et al.

(10) Patent No.: US 7,924,052 B1
(45) Date of Patent: Apr. 12, 2011

(54) FIELD PROGRAMMABLE GATE ARRAY ARCHITECTURE HAVING CLOS NETWORK-BASED INPUT INTERCONNECT

(75) Inventors: Wenyi Feng, Sunnyvale, CA (US); Jonathan Greene, Palo Alto, CA (US); Sinan Kaptanoglu, Belmont, CA (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 12/361,835

(22) Filed: Jan. 29, 2009

Related U.S. Application Data

(60) Provisional application No. 61/024,873, filed on Jan. 30, 2008.

(51) Int. Cl.
   *H01L 25/00* (2006.01)
(52) U.S. Cl. ............ 326/41; 710/317; 370/387; 370/388
(58) Field of Classification Search .............. 326/41; 710/316–317; 370/386–388
   See application file for complete search history.

(56) References Cited

U.S. PATENT DOCUMENTS

| | | | | |
|---|---|---|---|---|
| 5,157,654 A * | 10/1992 | Cisneros | ..................... | 370/414 |
| 5,495,476 A * | 2/1996 | Kumar | ..................... | 370/388 |
| 5,574,388 A * | 11/1996 | Barbier et al. | ................... | 326/41 |
| 5,657,241 A * | 8/1997 | Butts et al. | .................... | 716/103 |
| 5,940,389 A * | 8/1999 | Yang et al. | ..................... | 370/380 |
| 6,292,019 B1 | 9/2001 | New et al. | | |
| 6,294,928 B1 * | 9/2001 | Lytle et al. | ...................... | 326/41 |
| 6,335,930 B1 * | 1/2002 | Lee | ............................ | 370/387 |
| 6,341,313 B1 * | 1/2002 | Kanoh | .......................... | 709/227 |
| 6,594,261 B1 * | 7/2003 | Boura et al. | ................... | 370/389 |
| 6,636,932 B1 * | 10/2003 | Regev et al. | .................. | 710/317 |
| 6,868,084 B2 * | 3/2005 | Konda | ........................ | 370/395.1 |
| 6,975,139 B2 | 12/2005 | Pani et al. | | |
| 7,020,135 B2 * | 3/2006 | Klausmeier et al. | .......... | 370/388 |
| 7,023,841 B2 * | 4/2006 | Dell et al. | ..................... | 370/388 |
| 7,129,748 B1 | 10/2006 | McCollum et al. | | |
| 7,224,184 B1 * | 5/2007 | Levi et al. | ....................... | 326/41 |
| 7,319,695 B1 * | 1/2008 | Agarwal et al. | ............... | 370/388 |
| 7,321,237 B2 | 1/2008 | McCollum et al. | | |
| 7,397,796 B1 * | 7/2008 | Smiljani | ....................... | 370/390 |
| 7,408,383 B1 | 8/2008 | Feng et al. | | |
| 7,425,841 B2 | 9/2008 | Schmit et al. | | |
| 7,426,185 B1 * | 9/2008 | Musacchio et al. | ........ | 370/235.1 |
| 7,443,198 B1 | 10/2008 | McCollum | | |
| 7,480,246 B2 * | 1/2009 | Agarwal et al. | ............... | 370/235 |
| 7,490,189 B2 * | 2/2009 | Eberle et al. | .................. | 710/317 |
| 7,492,182 B2 | 2/2009 | McCollum et al. | | |
| 7,495,473 B2 | 2/2009 | McCollum et al. | | |
| 7,538,576 B2 | 5/2009 | McCollum et al. | | |
| 7,542,464 B2 * | 6/2009 | Fraser | ........................... | 370/355 |
| 7,586,909 B1 * | 9/2009 | Walrand et al. | ............... | 370/388 |

(Continued)

OTHER PUBLICATIONS

Feng, W. and Kaptanoglu, S., "Designing Efficient Input Interconnect Block for LUT Clusters Using Counting and Entropy," FPGA 2007.

(Continued)

*Primary Examiner* — Jason M Crawford
(74) *Attorney, Agent, or Firm* — Lewis and Roca LLP

(57) ABSTRACT

A cluster internal routing network for use in a programmable logic device with a cluster-based architecture employs a Clos network-based routing architecture. The routing architecture is a multi-stage blocking architecture, where the number of inputs to the first stage exceeds the number of outputs from the first stage.

21 Claims, 13 Drawing Sheets r1 (n1-by-m) crossbars     m (r1-by-r2) crossbars     r2 (m-by-n2) crossbars

U.S. PATENT DOCUMENTS

| | | |
|---|---|---|
| 7,587,697 B1 | 9/2009 | Schmit et al. |
| 7,653,891 B1 | 1/2010 | Anderson et al. |
| 2004/0095927 A1* | 5/2004 | Chang et al. .................. 370/388 |
| 2005/0117575 A1* | 6/2005 | Konda .......................... 370/389 |
| 2005/0275504 A1* | 12/2005 | Torza ........................... 340/2.22 |
| 2006/0001444 A1 | 1/2006 | Chua et al. |
| 2006/0186920 A1 | 8/2006 | Feng et al. |

OTHER PUBLICATIONS

Lemieux, Guy et al, "Design of Interconnection Networks for Programmable Logic," Book: Table of Contents, List of Figures, List of Tables, List of Symbols, Chapter 2 "Interconnection Networks," copyright 2004.

Yang, Y. et al., "On Blocking Probability of Multicast Networks," IEEE Transactions of Communications, Jul. 1998, vol. 46, No. 7, pp. 957-968.

Copending U.S. Appl. No. 12/362,844 entitled "Clustered Field Programmable Gate Array Architecture," filed Jan. 30, 2009.

Office Action mailed Jun. 14, 2010 in Copending U.S. Appl. No. 12/362,844 entitled "Clustered Field Programmable Gate Array Architecture," filed Jan. 30, 2009.

* cited by examiner

US 7,924,052 B1

FIELD PROGRAMMABLE GATE ARRAY ARCHITECTURE HAVING CLOS NETWORK-BASED INPUT INTERCONNECT

REFERENCE TO RELATED APPLICATIONS

This application claims an invention that was disclosed in Provisional Application No. 61/024,873 filed Jan. 30, 2008. The benefit under 35 USC §119(e) of the United States provisional application is hereby claimed, and the aforementioned provisional application is hereby incorporated herein by reference.

BACKGROUND OF THE INVENTION

1. Field of the Invention

The invention pertains to the field of integrated circuits. More particularly, the invention pertains to routing architectures for use in programmable logic based integrated circuit devices.

2. The Prior Art

Programmable logic devices such as Field Programmable Gate Array (FPGA) integrated circuit devices are known in the art. An FPGA comprises any number of initially uncommitted logic modules arranged in an array along with an appropriate amount of initially uncommitted routing resources. Logic modules are circuits which can be configured to perform a variety of logic functions like, for example, AND-gates, OR-gates, NAND-gates, NOR-gates, XOR-gates, XNOR-gates, inverters, multiplexers, adders, latches, and flip/flops. Routing resources can include a mix of components such as wires, switches, multiplexers, and buffers. Logic modules, routing resources, and other features like, for example, I/O buffers and memory blocks, are the programmable elements of the FPGA.

The programmable elements have associated control elements (sometimes known as programming bits or configuration bits) which determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the PLD power supply is disconnected, disabled or turned off. Non-volatile control elements, such as antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing resources can vary greatly and is appropriate for the type of control element used.

Typically a user creates a logic design inside manufacturer-supplied design software. The design software then takes the completed design and converts it into the appropriate mix of configured logic modules and other programmable elements, maps them into physical locations inside the FPGA, configures the interconnect to route the signals from one logic module to another, and generates the data structure necessary to assign values to the various control elements inside the FPGA.

Many FPGA architectures employing various different logic modules and interconnect arrangements are known in the art. Some architectures are flat while others are clustered.

In a flat architecture, the logic modules may or may not be grouped together with other logic modules, but all of the logic modules have similar or nearly equivalent access to the larger routing architecture. In a clustered architecture, the logic modules are grouped together into clusters, meaning that all of the logic modules in the cluster have some degree of exclusive routing interrelationship between them relative to logic modules in other clusters.

FIG. 1 illustrates a block diagram of a prior art logic cluster 100 which illustrates some basic principles of a clustered architecture. Internal cluster routing network 101 routes signals input to the cluster 100 from External Horizontal & Vertical Routing (EHVR) 114 and from logic cell output feedback lines to the inputs of logic cells 102. The internal cluster routing network 101 includes Cluster Internal Routing (CIR) 110, Cluster Input Multiplexers, an exemplary one being labeled 112, and Logic Function Generator Input Multiplexers (an exemplary instance being labeled 108). The box designated Cluster Internal Routing (CIR) 110 contains the cluster internal interconnects and the box designated External Horizontal & Vertical Routing (EHVR) 114 contains the external interconnects and other routing resources of the larger FPGA (not shown).

The illustrative logic cluster of FIG. 1 contains four logic cells (functional blocks), an exemplary instance being labeled 102, though any number can be present. A logic cell 102 may comprise a logic function generator circuit (or LFG) 104 and an associated sequential element 106 (designated SE in the diagram), typically a flip/flop that can also be configured to be a latch. The ones in the diagram have four logic input interconnects since in practice a 4-input look-up table (LUT) is the most common function generator in this sort of architecture. The output interconnect of each LFG is coupled to the data input interconnect of the associated sequential element. The output of each logic function generator and each sequential element is coupled to a functional block output interconnect. The output interconnect coupled to the function generator is a combinational output interconnect while the output interconnect coupled to the sequential element is a sequential output interconnect.

Typically there are other features present in functional block 104 that are not shown in FIG. 1. For example, there may be a way to bypass the LFG and connect from the routing resources to the data input interconnect of the sequential element, or specialized circuitry to make implementing arithmetic functions more efficient. Typically the sequential element is more complicated than the simple D-flip/flop shown in FIG. 1. Often there will be, for example, a set signal, a reset signal, an enable signal, a load signal, and a clock signal (shown but without its source) present. Collectively these signals are called sequential control input interconnects and they typically have their own associated routing resources that may or may not be coupled to the cluster routing resources shown in FIG. 1.

In FIG. 1, CIR 110 contains only routing wires, while EHVR 114 contains a variety of different elements like switches, multiplexers, and buffers in addition to routing wires. Functional block output interconnects are cluster output interconnects if they connect to the EHVR 114. If a functional block output interconnect connects to the CIR 110, it is called a feedback interconnect since it allows cluster outputs to feed back to inputs of LFGs in the same cluster without leaving and reentering the cluster by means of cluster outputs and external interconnect and routing resources. A functional block output interconnect can be both a cluster output interconnect and a feedback interconnect if it connects to both the CIR and EHVR.

In FIG. 1, the Logic Function Generator Input Multiplexers (an exemplary instance being labeled 108) are coupled between the Cluster Internal Routing block and the various logic input interconnects on the functional blocks 102. Since there are four functional blocks each with four input interconnects, there are a total of sixteen Logic Function Generator Input Multiplexers in the exemplary cluster 100. Typically, the number of input interconnects on each Logic Function Generator Input Multiplexer is less than the total number of lines in the Cluster Internal Routing Lines block, so each Logic Function Generator Input Multiplexer can only transmit a subset of the signals inside CIR 110 to its associated LFG input.

In the architecture 100 of FIG. 1, signals are transmitted from the EHVR to the CIR by ten Cluster Input Multiplexers, an exemplary one being labeled 112. Various interconnects and resources from other parts of the FPGA are connected to the inputs of the Cluster Input Multiplexers by means of the External Horizontal & Vertical Routing 114. The lines internal to the Cluster Internal Routing box 110 come from a variety of sources: the outputs of the Cluster Input Multiplexers, the outputs of the cluster's LFGs and SEs, and possibly other sources such as clock networks and other special functions not shown in FIG. 1 to avoid overcomplicating the diagram.

As FPGAs get larger, clustered architectures are favored over completely flat ones, based on the ease of place and route, and how fast this task can be accomplished by the design software. There are many examples of clustered architectures in both the academic literature as well as in commercial products.

FIG. 2 shows an exemplary cluster 200 of a type known in the art employing busses in a portion of the internal cluster routing. Present in FIG. 2 are functional blocks 202, Level 1 multiplexers 204a through 204j, EHVR 206, cluster input interconnect busses 208a through 208j, functional block output bus 210, and feedback interconnects 212. This is an abstraction intended to focus attention on the relationships between classes of interconnects inside cluster 200 rather than on the detailed connections of a specific circuit topology.

The external horizontal and vertical routing (EHVR) 206 contains routing interconnects and other routing resources such as, for example, multiplexers, buffers, and control elements for programming and enabling them. Placing the balance of the FPGA routing in box 206 is a deliberate abstraction to allow focusing on the relationships of classes of interconnects inside cluster 200.

The level 1 multiplexers 204a through 204j are coupled to EHVR 206 by cluster input interconnect busses 208a through 208j. While interconnect busses 208a through 208j couple EHVR 206 to the level 1 multiplexers 204a through 204j, they do not connect to the feedback interconnects 212. In FIG. 2, they can be thought of as "passing under" them instead. This convention will be used with respect to various interconnect representations throughout this application, since drawing such busses in the more conventional "passing over" style makes the drawing figures harder to read and obscures the concepts being illustrated.

Examples of clusters such as shown in FIG. 2 are found in a number of different commercial FPGA families offered by Xilinx, Inc., of San Jose, Calif. Another cluster 220 of the prior art is shown in FIG. 3. Present in the drawing figure are functional blocks 222, level 1 multiplexers 224a through 224j, local interconnects 226, level 2 multiplexers 228a through 228j, EHVR 230, interconnect busses 232a through 232j, interconnect busses 234a through 234j (though only 234j is labeled in the figure), functional block output bus 236, and feedback interconnects 236.

FIG. 4 shows another bus-based FPGA cluster 250 of the prior art. Present in the drawing figure are functional blocks 252, level 1 multiplexers 254a through 254j, level 1 interconnects 256, level 2 multiplexers 258a through 258j, level 2 interconnects 260, level 3 multiplexers 262a through 262j, input busses 264a through 264j, EHVR 266, functional block output bus 268, and feedback interconnects 270. Similar to the clusters shown in FIG. 2 and FIG. 3, the numbers of functional blocks, the numbers of first, second and third level multiplexers, the numbers of interconnects in the various interconnect busses, and the number of input channels on the various multiplexers are all a matter of design choice.

The data flow for external signals is through interconnects originating in EHVR 266 that are coupled to some of the inputs of the third level multiplexers 262a through 262j. The outputs of the level 3 multiplexers are coupled to the level 2 interconnections 260 which in turn are coupled to the inputs on the level 2 multiplexers 258a through 258j. The outputs of the level 2 multiplexers 258a through 258j are coupled to the level 1 interconnects 256 which are coupled to the inputs of the level 1 multiplexers 254a through 254j, which in turn have their outputs coupled to the inputs of the functional blocks 252. Thus the cluster inputs enter the internal cluster routing resources at the level 3 multiplexers.

Another prior art cluster architecture is described in the textbook Guy Lemieux and David Lewis, *Design of Interconnection Networks for Programmable Logic*, Kluwer Academic Publishers, 2004 (henceforth "Lemieux"), page 28, FIG. 3.4. Commercial products using similar architectures can be found in a number of FPGA families offered by Altera Corporation of San Jose, Calif.

In Lemieux, Chapter 2, Section 2.1, pages 9-17, highly routable switching networks are discussed in general, including references to a number of well known switching networks such as Clos networks and Benes networks. These networks can be used in anything from telecommunications systems to integrated circuits. Routing architectures using these types of network structures may be used in programmable logic devices as an internal cluster routing network. These networks typically have at least three stages of switches and can often be optimized for decreased numbers of switches and improved routablility by increasing the number of levels of switches that signals must pass through. Unfortunately, when such an approach is used in an FPGA cluster, the resulting performance degradation is undesirable.

The multi-stage switching network structure referred to as the Clos network was first proposed by Charles Clos in 1953. Clos networks are based on a grouping of interconnected crossbar switches. A crossbar switch is a device that is capable of channeling data from any of its inputs to any of its outputs, up to its maximum number of ports. In the case of a multiplexer-based crossbar switch, the number of inputs to the switch ("x") is the same as the number of inputs to each multiplexer. The number of outputs of the switch ("y") is equal to the number of multiplexers. An example of a multiplexer-based crossbar switch 400 is shown in FIG. 5. Each output (y) can be coupled to any of the x inputs independently. The crossbar switch has x*y crosspoints. As shown in FIG. 5, such a full crossbar can be implemented using y number of x-inputs-to-one-output ("x-to-1" or "x-1") multiplexers ("MUXes") 408. In the example shown in FIG. 5, x=4 and y=3.

An example of a general 5-parameter asymmetrical 3-stage Clos network is shown in FIG. 6. This network is defined by five parameters: m, the number of outputs from each crossbar in stage one (equals the number of crossbars in stage two and the number of inputs to each crossbar in stage three); n1, the number of inputs to each crossbar in stage one; r1, the number of crossbars in stage one (equals the number of inputs to each crossbar in stage two); n2, the number of outputs from each crossbar in stage three (equals the number of inputs to each logic cell); and r2, the number of crossbars in stage three (equals the number of outputs from each crossbar in stage two). These parameters constitute a 5-tuple (m, n1, r1, n2, r2), for the three levels of crossbars. The first level of crossbars consists of r1 (n1-to-m) full crossbars, the second level consists of m (r1-to-r2) full crossbars, and the third level consists of r2 (m-to-n2) full crossbars. The number of inputs to the Clos network shown in FIG. 6 is (r1*n1), while the number of outputs is (r2*n2). This network can be used to connect (r1*n1) inputs to r2 logic cells, each having n2 inputs.

FIG. 7 shows a symmetrical Clos network. A symmetrical Clos network is one in which n1=n2=n, and r1=r2=r. A symmetrical Clos network such as shown in FIG. 7 has only three parameters (m, n, and r).

The "cost" of a Clos network (i.e., the amount of area taken up by the network, as well as the number of switches, together with the delay caused in the network by this number of switches) is typically measured by the number of crosspoints used in the network. For the asymmetrical case, the cost is r1*n1*m+m*r1*r2+r2*m*n2=m* (r1*n1+r1*r2+r2*n2). For the symmetrical case, the cost is m*(r^2+2*r*n). The cost is proportional to m, the number of middle level crossbars. Hence, the bigger m is, the higher the cost.

The routability of a Clos network (i.e., the ability to route signals from the inputs to the outputs) also depends on m, the number of middle stage crossbars. The higher m is, the better the routability. Non-blocking networks are highly routable. There are three types of non-blocking Clos networks. The first is strictly non-blocking, in which for any connection request from an input to an output or a set of outputs, it is always possible to provide a connection path through the network without disturbing other existing connections. If more than one such path is available, any path can be selected without being concerned about realization of future potential connection requests. The second type is wide-sense non-blocking. In this type, for any connection request from an input to an output or a set of outputs, it is always possible to provide a connection path through the network without disturbing other existing connections. If more than one such path is available, the path must be selected carefully (according to some selection algorithm) to maintain the non-blocking behavior for future potential connection requests. The third type is rearrangeably non-blocking. In this type, for any connection request from an input to an output or a set of outputs, it is always possible to provide a connection path through the network by rearranging other existing connections, if necessary.

In communication networks, typically, the cost of a strictly non-blocking network architecture is too high to make implementation practical. Wide sense non-blocking is more practical and can be built more efficiently, and is therefore a more common implementation of Clos networks in the communications context.

There are two types of routing requests that may be made to route a signal in a Clos network. The first type is unicast, in which each input can be connected to at most one output in a one-to-one fashion. The second type is multicast, in which each input can be connected to multiple outputs. A network that is non-blocking for multicast routing requires a bigger m than a unicast non-blocking network, and hence has a higher cost.

Known bounds on m with respect to the routability include the following. For wide sense multicast non-blocking there are two cases: a symmetrical network and an asymmetrical network. For the symmetrical case, $m>\min((n-1)*(x+r^{1/x})$ where $1<=x<=\min(n-1,r)$; optimizing x results in $m>2(n-1)*(\log r/\log\log r)+(n-1)*(\log r)^{1/2}$. For the asymmetrical case, $m>(n1-1)x+(n2-1)*r2^{1/x}$, where $1<=x<=\min(n2-1, r2)$; optimizing x results in $m>2(n1-1)*(\log r2/\log\log r2)+(n2-1)*(\log r2)^{1/2}$. There is no known bound for rearrangeably multicast non-blocking. For strictly unicast non-blocking, $m>=n1+n2-1$ for the asymmetrical case, and $m>=2*n-1$ for the symmetrical case. For rearrangeably unicast non-blocking, $m>=\max(n1, n2)$ for the asymmetrical case, and $m>=n$ for the symmetrical case.

For unicast non-blocking networks, it has been shown that in many cases the network will function as mostly non-blocking for multicast as well (i.e., the probability that a multicast routing request will be blocked is fairly low). See Yang and Wang, *On Blocking Probability of Multicast Networks*, IEEE Transactions on Communications, Vol. 46, No. 7, July 1998.

Most multistage network research has focused on the creation of non-blocking networks. From the perspective of programmable logic devices such as FPGAs, the routing problem is rearrangeably multicast. It is multicast because it is common for the output of a logic cell to go to multiple locations. Also, it is rearrangeable because only the final routing solution needs to satisfy the routing requirements, while the intermediate steps are irrelevant because when routing one connection, it is acceptable to rearrange (rip up and reroute) existing connections until an acceptable solution is determined. This is performed by sophisticated routing software typically provided by FPGA vendors to end users.

However, using a rearrangeable multicast non-blocking network to implement an FPGA interconnect is impractical due to its high cost (even though the bound is unknown, it will be at least as large as the bound for unicast non-blocking, as described above). It has more flexibility than actually needed in a real-world FPGA interconnect. It also fails to exploit locality to save area, which is a characteristic FPGA designs exhibit.

U.S. Pat. No. 6,294,928 to Lytle et al. ("Lytle") discloses a Clos network-based programmable logic architecture employing crossbar switches. U.S. Pat. No. 6,975,139 to Pani, et al., ("Pani") also discloses a Clos network-based FPGA routing architecture. Pani discloses an organization of two columns of crossbars followed by a column of LUTs.

Most applications of a Clos network require that $m \geq n1$, which makes the network non-blocking for any set of unicast connections, though not necessarily for multicast connections. An example of a unicast non-blocking network having an $m \geq n1$ constraint is shown in FIG. 7. Prior art Clos network-based programmable logic architectures such as Lytle and Pani all include the constraint that $m \geq n1$. This restriction makes sense in the context of hierarchal architectures such as Pani. In hierarchical routing, a smaller number of signals from higher-level routing is expanded to drive a larger number of lower-level signals. The network disclosed in Pani is described as non-blocking and therefore the $m \geq n1$ is a critical feature of this network.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention provides an area-efficient and highly routable interconnect scheme for use in a programmable logic device, such as an FPGA, with a cluster-based architecture. This interconnect scheme may be used as an internal cluster routing network to provide routing for signals to be input to logic cells, such as look-up tables (LUTs), in the clusters. The interconnect scheme is a three-stage routing network based on a Clos network architecture.

The interconnect scheme of the present invention is not a non-blocking network (even for rearrangeably unicast signals) because implementing such an architecture would still have a high cost. Instead, the present invention comprises a blocking Clos network defined by certain relationships between the network parameters that define a Clos network.

The primary parameter relationship defining networks of the present invention is that the number of outputs from stage one of the network is less than the number of inputs to stage one (m<n1). This is in contrast to Clos network-based communication networks, for which a blocking network is highly undesirable, and is also in contrast to prior art programmable logic architectures, where n1 is less than m. This invention uses a Clos network with n1>m (m smaller than n1) in FPGA input interconnect. This configuration provides high routability in an environment where a non-blocking network is not essential due to the flexibility in the rest of the programmable logic interconnect.

Despite the lack of a requirement that the routing architecture of the present invention be non-blocking, it still functions as non-blocking for certain cases. For example, as long as not more than m signals are required to be routed in each of the first stage crossbars, the network functions as non-blocking for unicast signals. Furthermore, blocking cases can be avoided by rerouting the signals outside the routing architecture. This is possible if there is enough flexibility in other portions of the programmable logic device routing fabric.

Figure 1:
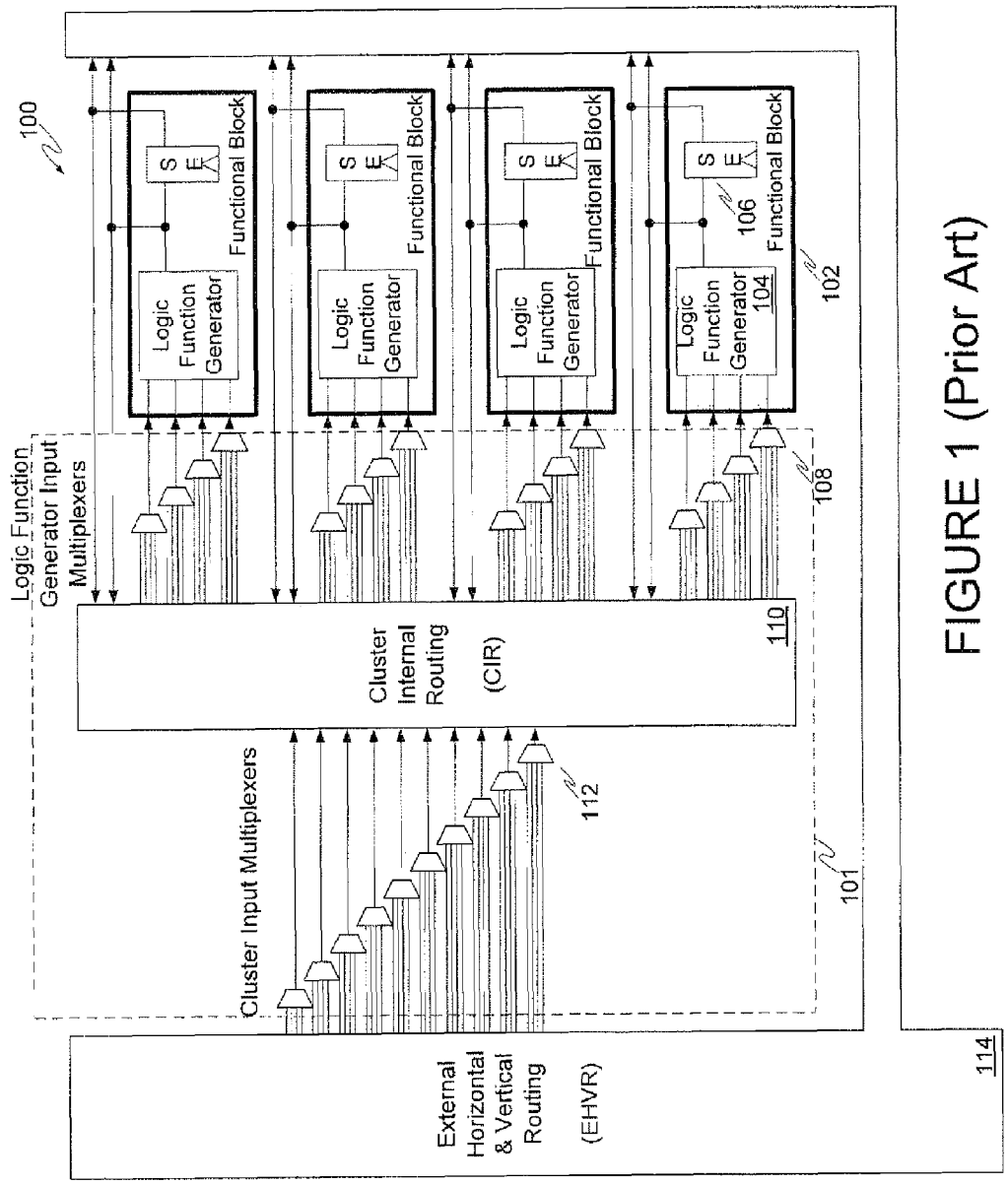
FIG. 1 is a diagram showing a logic cluster of the prior art.
Figure 2:
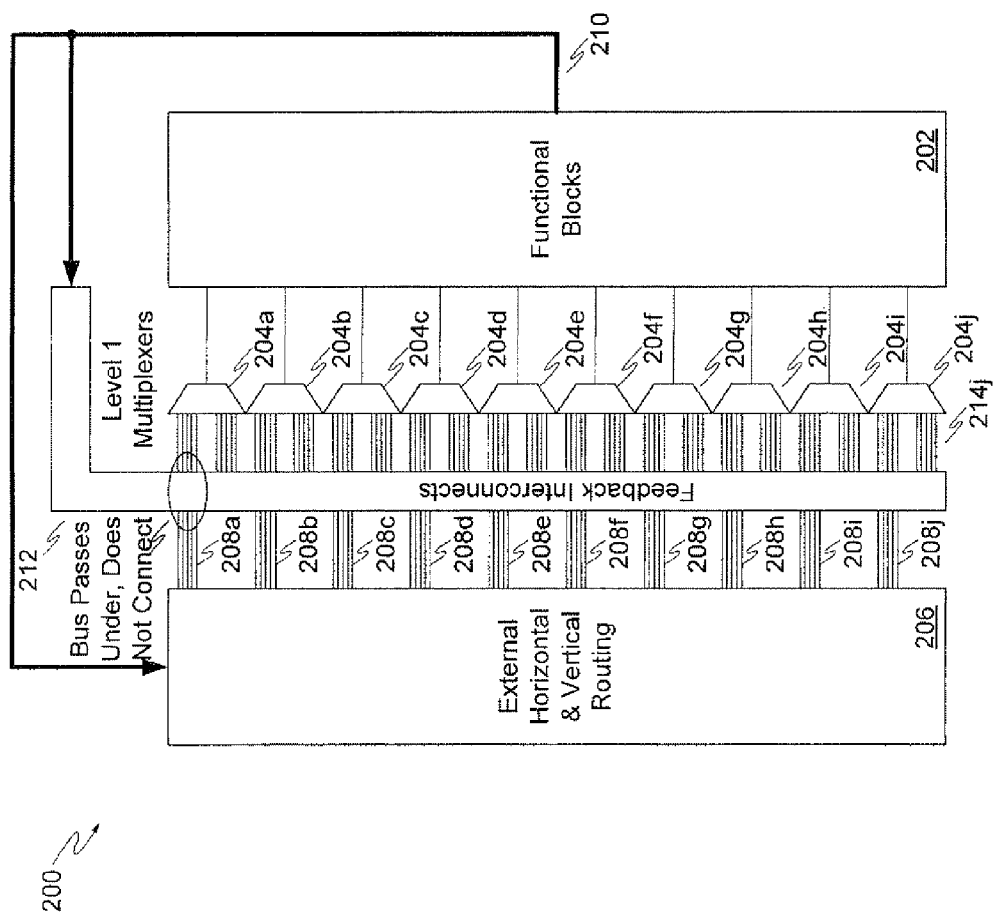
FIG. 2 is a diagram showing another logic cluster of the prior art.
Figure 3:
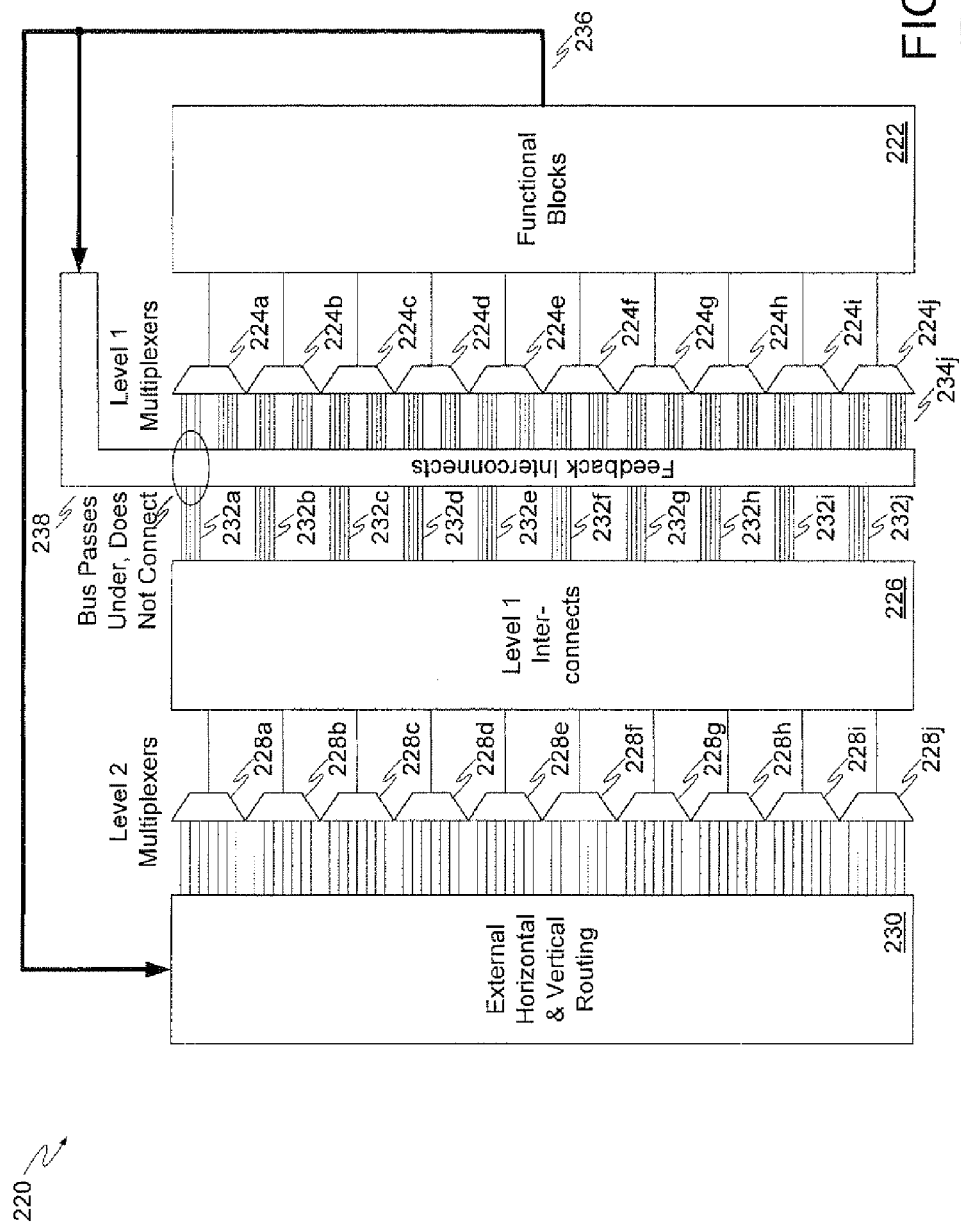
FIG. 3 is a diagram showing another logic cluster of the prior art.
Figure 4:
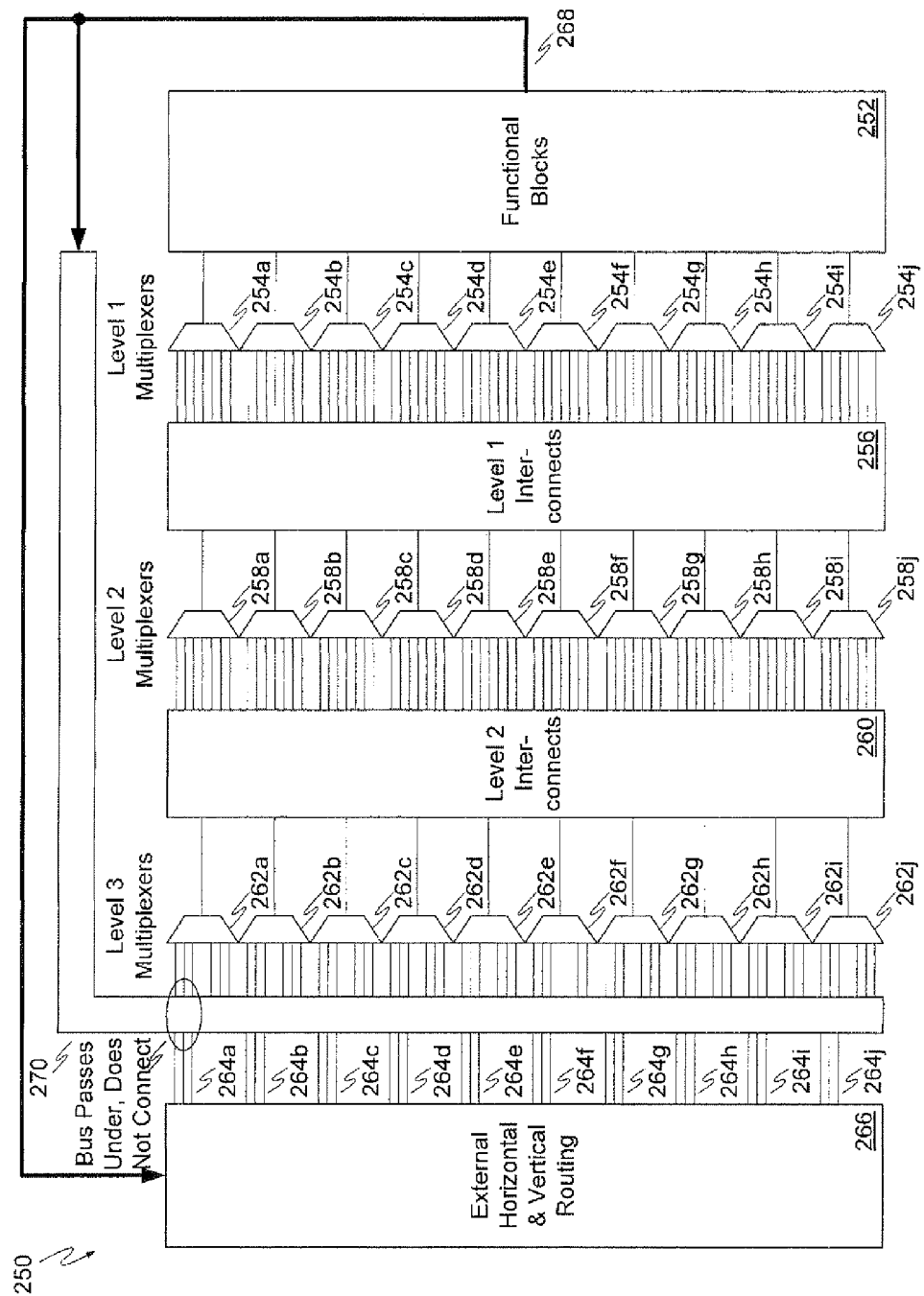
FIG. 4 is a diagram showing another logic cluster of the prior art.
Figure 5:
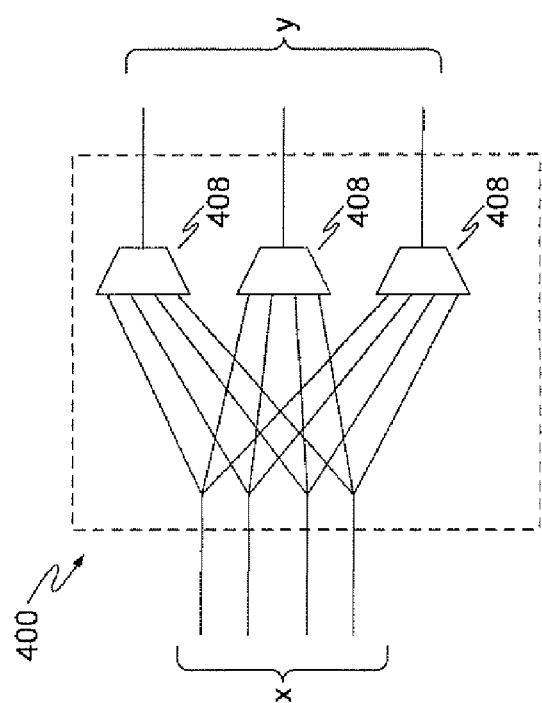
FIG. 5 is a diagram showing a multiplexer-based crossbar switch of the prior art.
Figure 6:
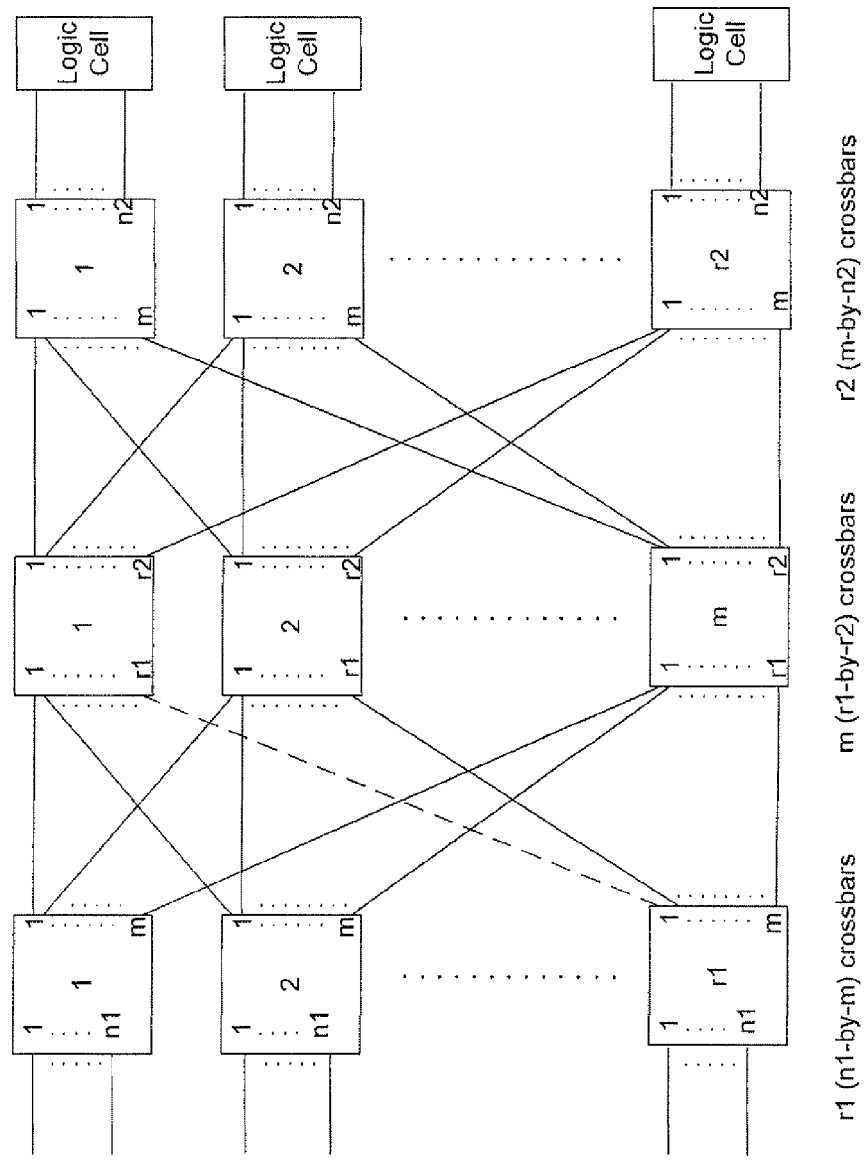
FIG. 6 is a diagram showing a routing network architecture of the prior art.
Figure 7:
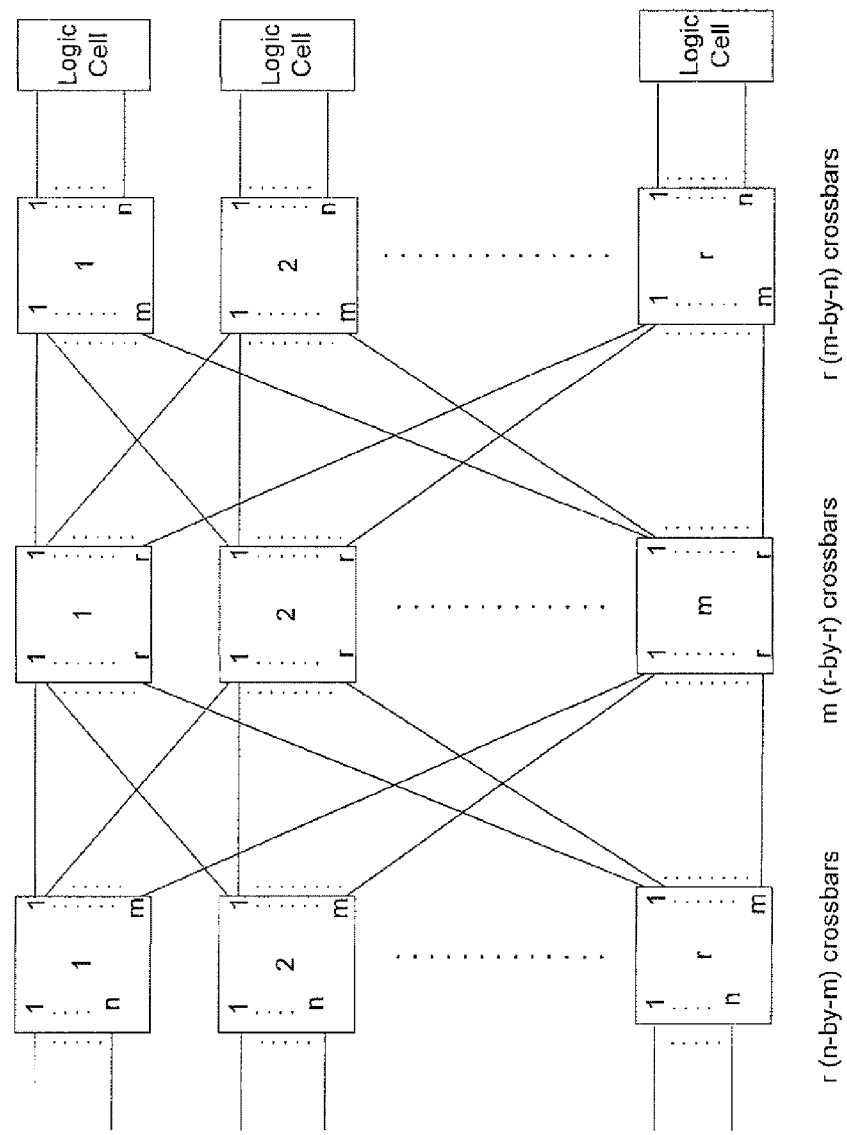
FIG. 7 is a diagram showing another routing network architecture of the prior art.
Figure 8:
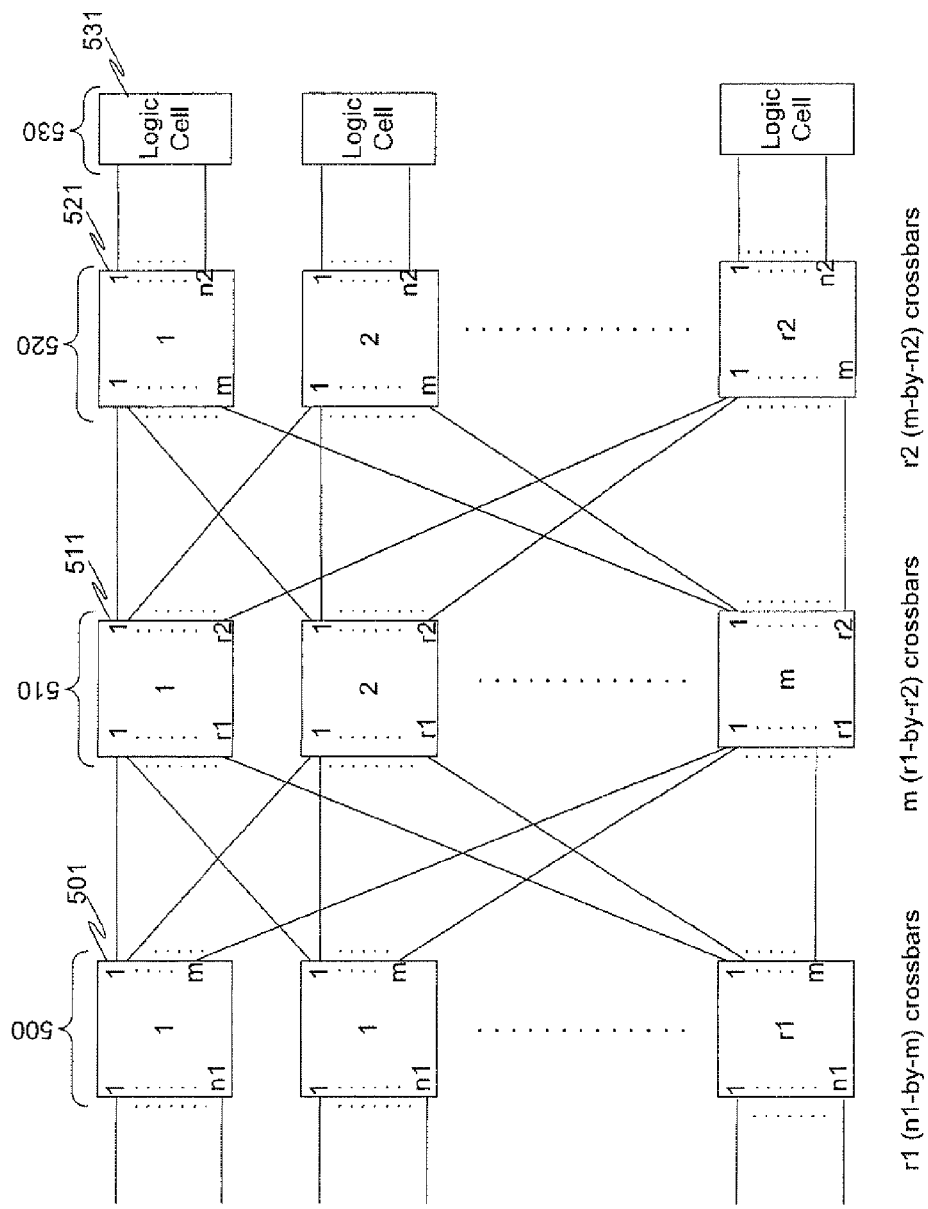
FIG. 8 is a diagram showing a routing network architecture of the present invention.

An embodiment of the present invention is illustrated in FIG. 8. In this embodiment, the routing network is a three-stage network comprised of three stages of crossbar switches (e.g., multiplexer-based crossbar switches). The first stage 500 is comprised of r1 crossbars 501, each having n1 inputs and m outputs. To avoid over-complicating the figure, only selected inputs and outputs of the crossbar switches and logic cells of FIG. 8 are shown. The dotted lines in FIG. 8 represent repeated elements such as crossbar switches, input lines, output lines, and their labels not shown in the figure.

The n1 inputs to each first-stage crossbar 501 may receive signals from an external routing architecture of a programmable logic device such as an FPGA that includes a routing architecture of the present invention. The m outputs of first stage crossbars 500 are connected to the r1 inputs of the stage two crossbars 510. The r2 outputs of the stage two crossbar switches 510 are connected to the m inputs of the stage three crossbar switches 520. The n2 outputs of the stage three crossbar switches 520 are connected to the set of logic cells 530. Logic cells 530 may be, for example, LUT-based logic cells.

A preferred embodiment of the Clos network-based routing architecture of the present invention has the relations among its parameters described below. First, the number of LUTs (or logic cells) in the cluster (r2) ranges from 8 to 32. This is because when r2 is too big, then the cost of implementing such a Clos network in a programmable logic device becomes too high. For designs where r2 is quite small, a 1-level full crossbar could be the better solution with comparable area but smaller delay, however since r2 is dictated by the number of logic cells in the cluster, many FPGA designs will require larger clusters with r2 being too large for such a one-level solution to be efficient.

Second, the number of inputs of each logic cell, also the number of outputs from the third stage of crossbars (n2) ranges from 3-8. This is because typical LUT sizes used in programmable logic are in this range. For example, to connect to a cluster of 12 4-input LUTs, the number of outputs of the Clos network is 48, while the number of inputs could be at most a small multiple of the number of inputs, for example, 5×48.

Third, m, which represents the number of outputs (and multiplexers) for each crossbar in the first level, as well as the number of crossbars in the second level, and the number of inputs for each crossbar in the third level, is greater than or equal to n2 (m>=n2). This is because a logic cell does not typically need the same signal to be connected to both its inputs, and since the last stage of the three-stage routing network is a set of (m-by-n2) crossbars, therefore m needs to be greater than n2.

The present invention is intended to be used in a programmable logic device such as an FPGA where inter-cluster routing is organized in a uniform mesh. For this reason, the parameter n1≧m, is employed because signals from many external routing tracks must be concentrated down into a smaller number of LUT inputs. Even though the network is not guaranteed to be non-blocking, it is still very routable, even for multicast connections.

Fourth, the number of crossbars in the first stage, which is also the number of inputs to each crossbar in the second stage (r1) is in the range expressed by: 0.5*r2<=r1<=2*r2. m*r1 is the number of signals after the first stage of crossbars. Generally, it should be more than half of the number of total LUT inputs to guarantee logic utilization. If input bandwidth constraint is not desired, then r1 should be greater than or equal to r2, however a bigger r1 will raise the cost of the Clos network, so r1=r2 is typically a good value.

Fifth, the number of inputs to each crossbar in the first level of crossbars in the routing network (n1) is greater than or equal to m (n1>=m). In a preferred embodiment, the number of inputs into the routing network (n1*r1) is at least the number of total LUT inputs to prevent a bandwidth limitation on the cluster.

When n1 is bigger than m, a Clos network becomes rearrangeably blocking even for unicast. However, if the number of signals to be used by the logic cells is limited to be smaller than m for each input crossbar, then the network becomes rearrangeably non-blocking for unicast. Furthermore, in practice, good routability for multicast as well is observed for this network.

Figure 9A:
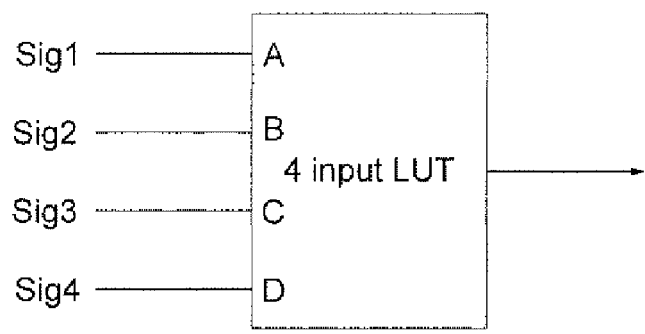
FIG. 9A is a diagram showing a look-up table of the prior art.
Figure 9B:
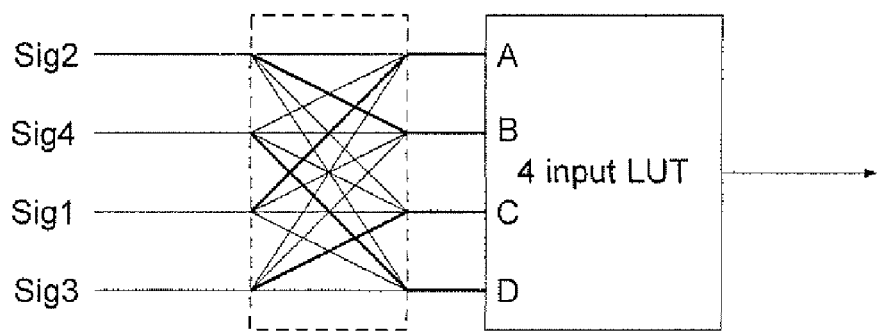
FIG. 9B is a diagram showing a look-up table of the prior art.

For the case when the inputs to the logic cell are swappable (for example where the logic cell is a LUT), that capability can be used to function as a third set of crossbars. For the purposes of illustrating this point, FIGS. 9A and 9B show LUTs as known in the art. As shown in FIGS. 9A and 9B, the swappability of LUT inputs is equivalent to a crossbar. For example, in a 4-input LUT, such as shown in FIGS. 9A and 9B, because the 4 inputs are equivalent, the 4 signals that need to reach the LUT can be routed to its 4 inputs in any order. This is equivalent to a 4×4 full crossbar in front of the LUT, as shown in FIGS. 9A and 9B. Because of this feature, in the case where the logic cell is a LUT, m should be equal to n2.

Figure 10:
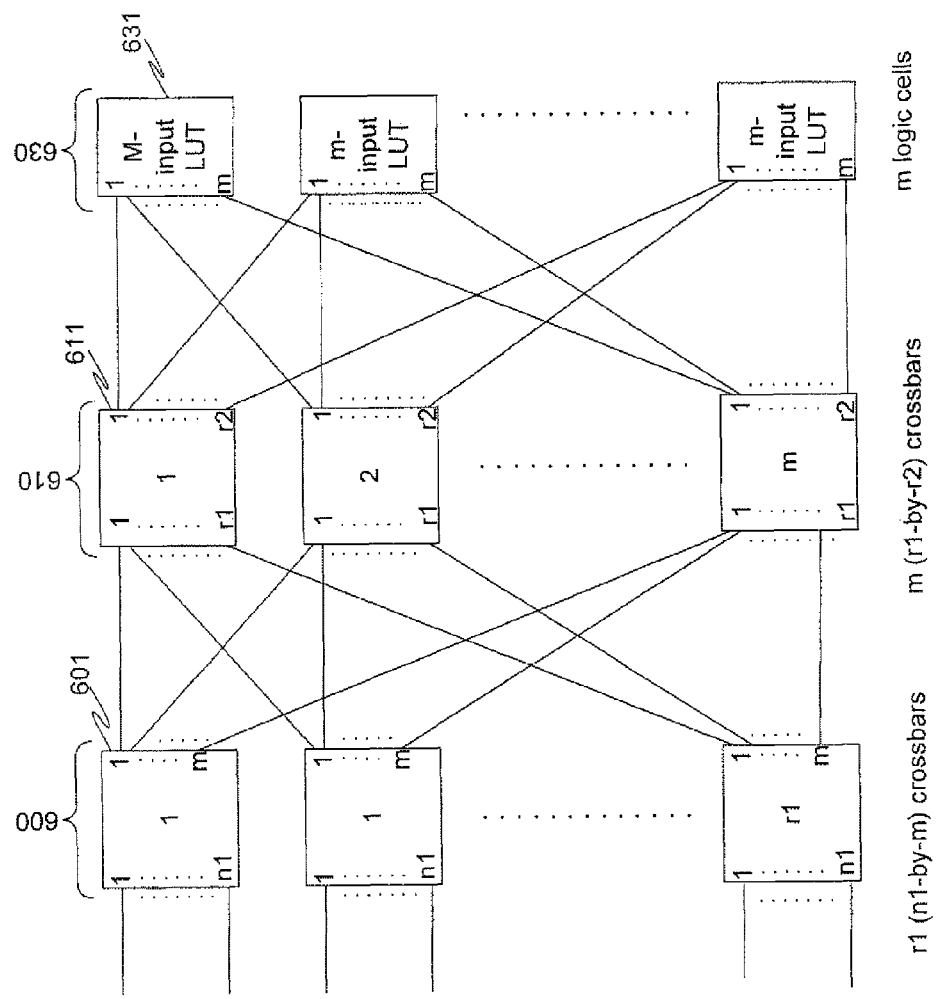
FIG. 10 is a diagram showing another routing network architecture of the present invention.

When the logic cell is a LUT, all of its inputs are logically equivalent and swappable. So when m=n2, the full crossbars in the third level of the Clos network are of size m-by-n2 and can be implemented using the logic equivalency of the LUT inputs. FIG. 10 shows an embodiment of the present invention in which r2 m-input logic cells 630 are comprised of LUTs. In this embodiment, the swappability of the LUT inputs operates as a third level of crossbar switches (i.e., is functionally equivalent to a third level of crossbar switches). In other words, the third stage of r2 full crossbars is implemented virtually by the logic equivalency of LUT inputs. This can result in a large savings in the implementation cost of the routing network.

In some applications, the efficiency of a routing network of the present invention may be increased by providing high-speed connections into the network. These high-speed or "fast" connections may operate at higher speeds than "regular" routing lines due to a number of factors, such as being routed through fewer transistors or other electronic structures that can cause propagation delay, or reduced capacitance on a fast signal line. In some embodiments, such as some of those employing fast connections, not all crossbars in a stage of the network will have the same number of inputs. In the first stage, certain crossbars could have either a reduced or expanded number of inputs, while in later stages, certain crossbars in a stage could have an expanded number or "extra" inputs. Two embodiments of the present invention employing fast connections are shown in FIGS. 11 and 12.

Figure 11:
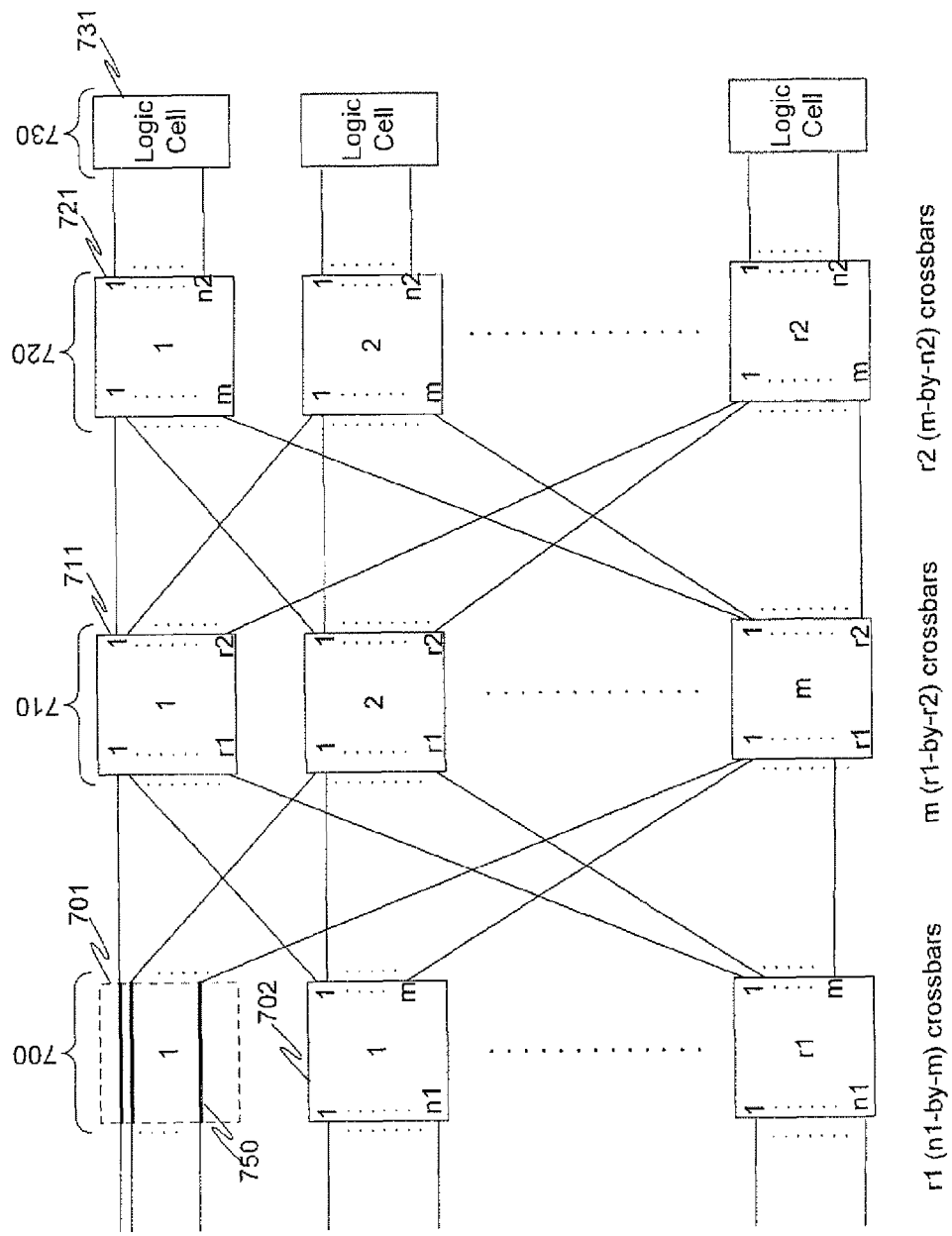
FIG. 11 is a diagram showing another routing network architecture of the present invention.

In the embodiment of the invention shown in FIG. 11, the first crossbar switch in the first stage 700 is shown replaced with a fast direct connect (1-1 input to output connections) "switch" 701. This is not truly a "switch" or a "crossbar" because it is a collection of direct connections, however it can be thought of as a special case of a switch where the number of inputs equals the number of outputs (n1=m) and each input is hardwired to a single output. This creates fast direct paths 750 for the m fast inputs (they are guaranteed to route), an important feature in an FPGA interconnect. The network will remain unicast non-blocking as long as at most m inputs of each crossbar are used.

Figure 12:
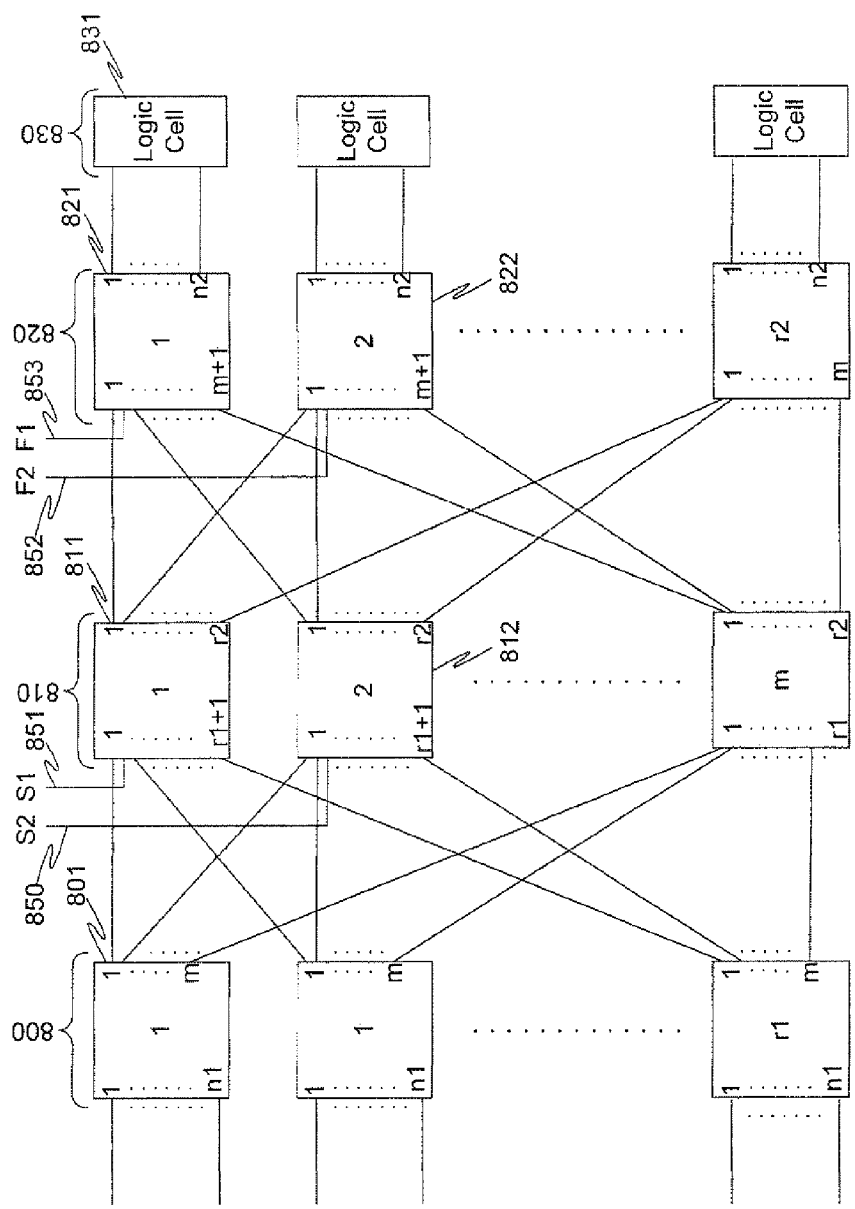
FIG. 12 is a diagram showing another routing network architecture of the present invention.

FIG. 12 shows another embodiment of the invention using fast inputs. As shown in FIG. 12, fast inputs are provided as inputs into stages of the routing network. F1 and F2 (852 and 853) are the fast inputs to the last stage 820, while S1 and S2 (850 and 851) are the fast inputs to the middle stage 810. Adding the fast inputs 850 and 851 to the second-stage crossbars 811 and 812 increases the total number of inputs to each crossbar 811, 812 to r1+1. Adding the fast inputs 852 and 853 to the third-stage crossbars 821 and 822 increases the total number of inputs to each crossbar 821, 822 to m+1. Since only certain signals may be on a "critical path" through the network, providing a few fast connections may dramatically increase the overall speed of the network for many logic designs by routing the "critical path" signals at higher speed and allowing non-critical signals (that do not affect the overall speed at which the network can operate) to be routed via normal network interconnects.

Figure 13:
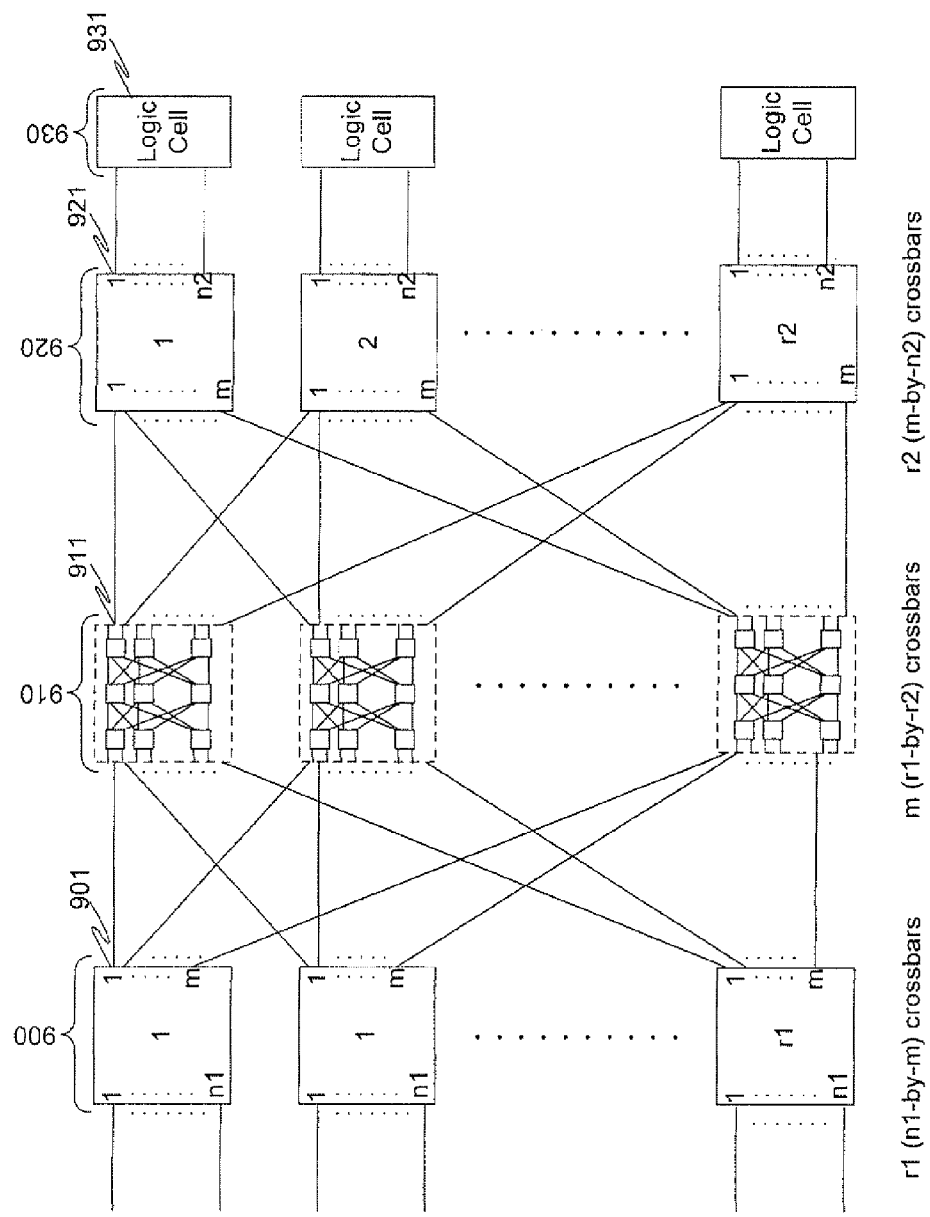
FIG. 13 is a diagram showing another routing network architecture of the present invention.

Although figures thus far have illustrated 3-stage routing networks, it is to be understood that the present invention includes routing networks of any number of stages, provided that the network parameters that define the present invention are embodied. For example, FIG. 13 shows a routing network according to the present invention implemented as a 5-stage routing network. As shown in FIG. 13, this embodiment may be thought of, or modeled, as a three-stage network, where the middle stage is itself comprised of a 3-stage routing network. Another way to think of this is that the middle stage crossbars 910 are themselves implemented as multi-stage Clos networks (may also be referred to as "sub-networks") of crossbars 911, rather than as a single stage of multiplexer-based crossbars. This process can be repeated iteratively, creating still larger numbers of stages in the routing network.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A programmable logic routing network, comprising:
   a first stage of crossbar switches, each crossbar switch having inputs and outputs;
   a second stage of crossbar switches, each crossbar switch having inputs and outputs;
   a third stage of crossbar switches, each crossbar switch having inputs and outputs;
   a plurality of logic cells having inputs and outputs;
   wherein:
   the outputs of the crossbar switches of the first stage are connected to the inputs of the crossbar switches of the second stage;
   the outputs of the crossbar switches of the second stage are connected to the inputs of the crossbar switches of the third stage;
   the outputs of the crossbar switches of the third stage are connected to the inputs of the logic cells;
   the number of inputs to the first stage of crossbar switches exceeds the number of outputs from the first stage of crossbar switches and wherein:
   each switch of the second stage of crossbar switches comprises:
   a fourth stage of crossbar switches, each crossbar switch having inputs and outputs;
   a fifth stage of crossbar switches, each switch having inputs and outputs;
   a sixth stage of crossbar switches, each switch having inputs and outputs;
   wherein:

the outputs of the crossbar switches of the fourth stage are connected to the inputs of the crossbar switches of the fifth stage;

the outputs of the crossbar switches of the fifth stage are connected to the inputs of the crossbar switches of the sixth stage;

the outputs of the crossbar switches of the sixth stage are connected to the inputs of the crossbar switches of the third stage; and the number of inputs to the fourth stage of crossbar switches exceeds the number of outputs from the fourth stage of crossbar switches.

2. A routing network in a programmable logic device, the routing network having first, second, and third stages of crossbar switches, each stage having a number of crossbar switches, each crossbar switch having a number of inputs and a number of outputs, the outputs of the first stage crossbar switches being connected to the inputs of the second stage crossbar switches, the outputs of the second stage crossbar switches being connected to the inputs of the third stage crossbar switches, and the outputs of the third stage of crossbar switches being connected to logic cells via a number of logic cell inputs, the routing network having parameters m, n1, r1, n2, and r2, comprising:

m number of outputs from each first stage crossbar switch, m number of second stage crossbar switches, and m number of inputs to each third stage crossbar switch;

n1 number of inputs to each first stage crossbar switch;

r1 number of first stage crossbar switches, and r1 number of inputs to each second stage crossbar switch;

n2 number of outputs from each third stage crossbar switch, and n2 number of inputs to each logic cell; and r2 number of stage three switches, and r2 number of outputs from each stage two crossbar switches, wherein:

n1 is greater than m.

3. The routing network of claim 2, wherein:

m is greater than or equal to n2.

4. The routing network of claim 3, wherein:

r1 is a number in the range of half of r2 to twice r2.

5. The routing network of claim 4, wherein:

m times r1 is greater than half of (n2 times r2).

6. The routing network of claim 5, wherein:

r1 is greater than r2.

7. The routing network of claim 5, wherein:

r1 is equal to r2.

8. The routing network of claim 5, wherein:

n1 times r1 is at least equal to (n2 times r2).

9. The routing network of claim 2, wherein:

each second stage crossbar switch is comprised of a routing sub-network.

10. The routing network of claim 9, wherein:

each routing sub-network comprising a second stage crossbar switch has r1 inputs and r2 outputs.

11. The programmable logic routing network of claim 2, further comprising at least one direct input connected to at least one of a crossbar switch of the second stage of crossbar switches and a crossbar switch of the third stage of crossbar switches without passing through a crossbar switch of the first stage of crossbar switches.

12. The programmable logic routing network of claim 11 wherein the at least one direct input is connected to at least one of a crossbar switch of the second stage of crossbar switches and a crossbar switch of the third stage of crossbar switches by passing through a direct hardwired connection in the first stage.

13. The programmable logic routing network of claim 11 wherein the at least one direct input is connected to at least one of a crossbar switch of the second stage of crossbar switches and a crossbar switch of the third stage of crossbar switches directly from outside of the programmable logic routing network.

14. A routing network in a programmable logic device, the routing network having first and second stages of crossbar switches, each stage having a number of crossbar switches, each crossbar switch having a number of inputs and a number of outputs, the outputs of the first stage crossbar switches being connected to the inputs of the second stage crossbar switches, the outputs of the second stage crossbar switches being connected to inputs of LUT-based logic cells having swappable inputs, the routing network having parameters m, n1, r1, and r2, comprising:

m number of outputs from each first stage crossbar switch, m number of second stage crossbar switches, and m number of inputs to each LUT-based logic cell;

n1 number of inputs to each first stage crossbar switch;

r1 number of first stage crossbar switches, and r1 number of inputs to each second stage crossbar switch;

r2 number of logic cells, and r2 number of outputs from each stage two crossbar, wherein:

n1 is greater than m.

15. The routing network of claim 14, wherein:

r1 is a number in the range of half of r2 to twice r2.

16. The routing network of claim 14, wherein:

r1 is at least equal to r2.

17. The routing network of claim 14, wherein:

each second stage switch is comprised of a routing sub-network.

18. The routing network of claim 17, wherein:

each routing sub-network comprising a second stage switch has r1 inputs and r2 outputs.

19. The programmable logic routing network of claim 14, further comprising at least one direct input connected to at least one of a crossbar switch of the second stage of crossbar switches and a crossbar switch of the third stage of crossbar switches without passing through a crossbar switch of the first stage of crossbar switches.

20. The programmable logic routing network of claim 19 wherein the at least one direct input is connected to at least one of a crossbar switch of the second stage of crossbar switches and a crossbar switch of the third stage of crossbar switches by passing through a direct hardwired connection in the first stage.

21. The programmable logic routing network of claim 19 wherein the at least one direct input is connected to at least one of a crossbar switch of the second stage of crossbar switches and a crossbar switch of the third stage of crossbar switches directly from outside of the programmable logic routing network.

* * * * *